United States Patent
Ohtomi

(12) 
(10) Patent No.: US 11,029,604 B2
(45) Date of Patent: Jun. 8, 2021

(54) IMMERSION POST-EXPOSURE BAKE LITHOGRAPHY PROCESS AND SYSTEMS

(71) Applicant: SANDISK TECHNOLOGIES LLC, Addison, TX (US)

(72) Inventor: Eisuke Ohtomi, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 212 days.

(21) Appl. No.: 16/182,867

(22) Filed: Nov. 7, 2018

(65) Prior Publication Data
US 2020/0142315 A1 May 7, 2020

(51) Int. Cl.
*G03F 7/40* (2006.01)

(52) U.S. Cl.
CPC .................... *G03F 7/40* (2013.01)

(58) Field of Classification Search
CPC ........................................... G03F 7/40
See application file for complete search history.

(56) References Cited

U.S. PATENT DOCUMENTS

| 9,651,870 B2 * | 5/2017 | Chen ................. G03F 7/38 |
| 9,985,046 B2 | 5/2018 | Lu et al. |
| 2017/0358594 A1 | 12/2017 | Lu et al. |

* cited by examiner

*Primary Examiner* — Kathleen Duda
(74) *Attorney, Agent, or Firm* — The Marbury Law Group PLLC

(57) ABSTRACT

A method of performing extreme ultraviolet lithography process includes applying a protic solvent over an extreme ultraviolet (EUV) photoresist layer located over a substrate after exposure to EUV radiation, heating the protic solvent on the EUV photoresist layer to a post-exposure bake temperature photoresist, and removing the protic solvent from above the EUV photoresist layer prior to developing the EUV photoresist layer.

17 Claims, 5 Drawing Sheets

IMMERSION POST-EXPOSURE BAKE LITHOGRAPHY PROCESS AND SYSTEMS

FIELD

The present disclosure relates generally to a photolithography process, and specifically to an extreme ultraviolet (EUV) photolithography process using an immersion post-exposure back step and an apparatus for implementing the same.

BACKGROUND

Extreme Ultra-Violet (EUV) lithography is one of the most promising next generation lithography techniques. EUV lithography allows formation of a super-fine photoresist pattern having a half pitch smaller than 20 nm without using multiple patterning processes. A finer lithography pattern means a higher density of memory cells or a smaller area of circuits. Thus, EUV lithography is highly desirable in logic LSI, DRAM and flash memory development.

SUMMARY

According to an aspect of various embodiments, a method of performing extreme ultraviolet lithography process includes applying a protic solvent over an extreme ultraviolet (EUV) photoresist layer located over a substrate after exposure to EUV radiation, heating the protic solvent on the EUV photoresist layer to a post-exposure bake temperature photoresist, and removing the protic solvent from above the EUV photoresist layer prior to developing the EUV photoresist layer.

According to another aspect of various embodiments, an extreme ultraviolet (EUV) lithography system includes an immersion post-exposure bake (PEB) module configured to apply a protic solvent to a EUV photoresist layer over a substrate and to subsequently dry the EUV photoresist layer by removing the protic solvent.

DETAILED DESCRIPTION

As discussed above, embodiments of the present disclosure are directed to an extreme ultraviolet (EUV) photolithography process using an immersion post-exposure back step and an apparatus for implementing the same, the various aspects of which are described below.

A major challenge to EUV light source development is insufficient power of the light source, which causes significant throughput loss. While additional challenges in photoresist performance, pellicle development, and commercial availability need to be addressed as well, the insufficient power level of the light sources is considered to be the biggest challenge in the EUV lithography development, especially for the purpose of flash memory manufacturing.

As noted above, a challenge in developing EUV lithography is insufficient power of the light source, which slows the throughput in manufacturing. The problem of low throughput is more acute with high resolution EUV lithography using high numerical (NA). Although high NA EUV lithography allows patterning of finer line, space and hole patterns on a wafer, it requires more mirrors in the optical system. The total number of mirrors in the optical system continues to increase in latest generation EUV scanners. The maximum reflection rate of mirrors in the EUV wavelengths is generally about 0.7, which means that the addition of two mirrors halves the EUV light power exposing the photoresist layer. Thus, even if the current target of 250 W power output for processing 125 wafers were to be realized in an EUV scanner, the EUV power supply may not be sufficient to fully expose the EUV photoresist materials. Ongoing efforts to address this problem include photoresist process development. However, such efforts degrade other lithography performance metrics, such as line edge roughness, critical dimension (CD) uniformity, and resolution. Some photoresist materials including metal nanoparticles raise a contamination issue for other equipment in a manufacturing line.

Various embodiments provide improved development of photoresist layers in EUV lithography by applying a protic solvent to the photoresist layers after exposure to EUV radiation. Applying the protic solvent according to various embodiments makes more protons available for deprotection of the photoresist layer, thereby improving throughput in EUV lithography processes.

Figure 1:
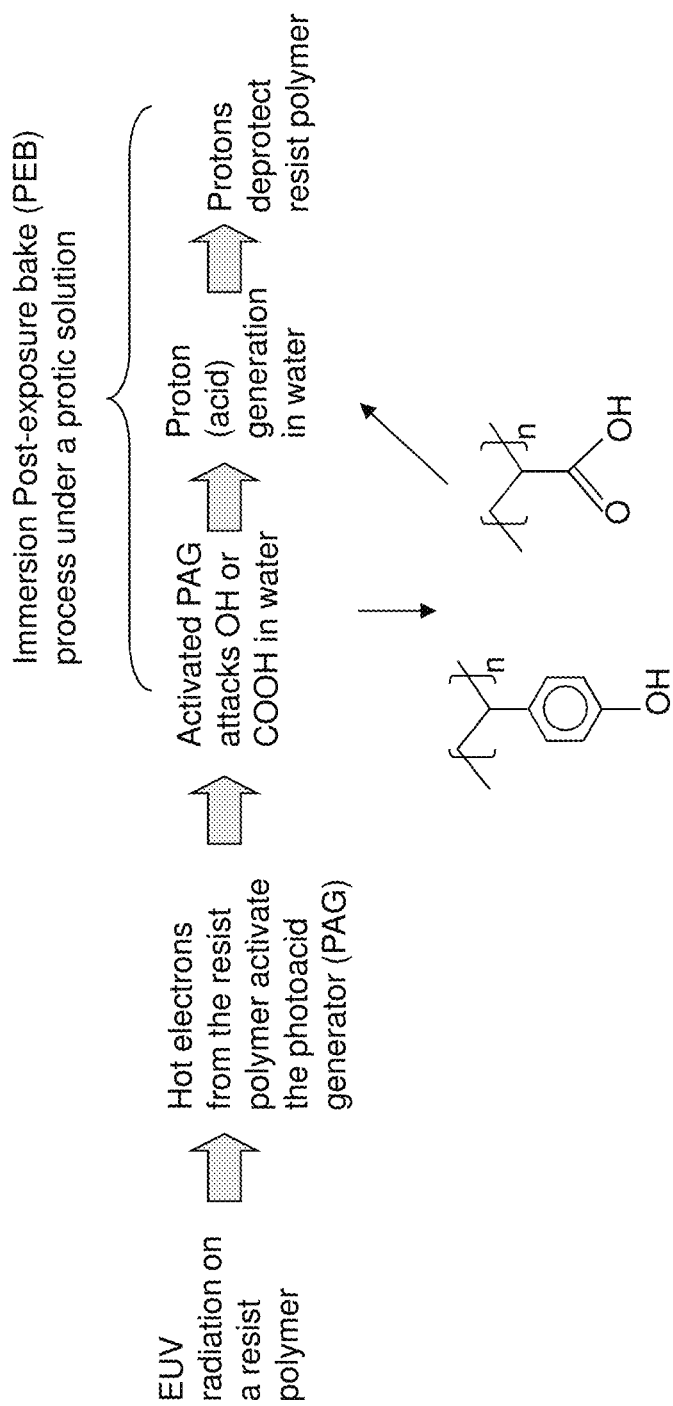
FIG. 1 is a schematic diagram that illustrates a process sequence that includes an EUV exposure process and a post-exposure bake process according to an embodiment of the present disclosure.

Referring to FIG. 1, a process sequence according to an embodiment of the present disclosure is illustrated, which includes an EUV exposure process and an immersion post-exposure bake process. The immersion post-exposure bake process of various embodiments provides development of a lithographic pattern with less EUV irradiation on the EUV photoresist layer, thereby enabling a shorter EUV exposure time for the lithographic patterning process and increasing the throughput of the EUV lithography system.

An EUV photoresist has a more complex reaction scheme than conventional photoresist materials. While acid generation by activated photoacid generators (PAGs) and deprotection of polymer by acid are common reactions between conventional lithography and EUV lithography, acid generation in EUV lithography photoresist materials requires more than just activated PAGs. When exposed to light during the lithographic patterning process, hot electrons are ejected when photons are absorbed by photoresist atoms and the hot electrons activate nearby PAG molecules. In EUV lithography, a PAG molecule activated by a hot electron attacks hydroxyl or carboxyl groups in the photoresist polymer. In this reaction, protons are emitted that attack protection groups in a polymer chain of the photoresist material. The protection groups attacked by protons manifest a drastic change in solubility for alkaline aqueous solution and thus are deprotected. This reaction scheme reveals that the number of protons generated by the PAG activated by EUV radiation gives the limit of a chemically amplified photoresist (CAR) photoresist sensitivity. Thus, when protons can be generated more easily, the EUV lithography process can have a higher throughput.

The reaction scheme of an EUV photoresist begins when hot electrons (represented as "e–*") are generated by irradiating a photoresist polymer layer with EUV light through a reticle and a lens system. The hot electrons activate photoacid generators (PAGs) in the EUV photoresist. The activated PAG's attack the —OH groups or the —COOH groups in the EUV photoresist and generate protons (H+), which deprotect the photoresist polymer.

To facilitate generation of protons (H+), in various embodiments of the present disclosure a protic solvent (e.g., water) is applied to the EUV photoresist after exposure to EUV light and the assembly (i.e., substrate, photoresist and protic solvent) are backed for a period of time. The operations of applying the protic solvent and baking the assembly are referred to herein as an "immersion post-exposure bake (PEB) process." The immersion PEB process provides more protons (H+) for deprotecting photoresist polymer molecules, thereby enabling deprotection of the photoresist polymer layer with less EUV irradiation on the EUV photoresist than other EUV photolithography processes, thereby enabling higher throughput in EUV lithography systems.

Figure 2:
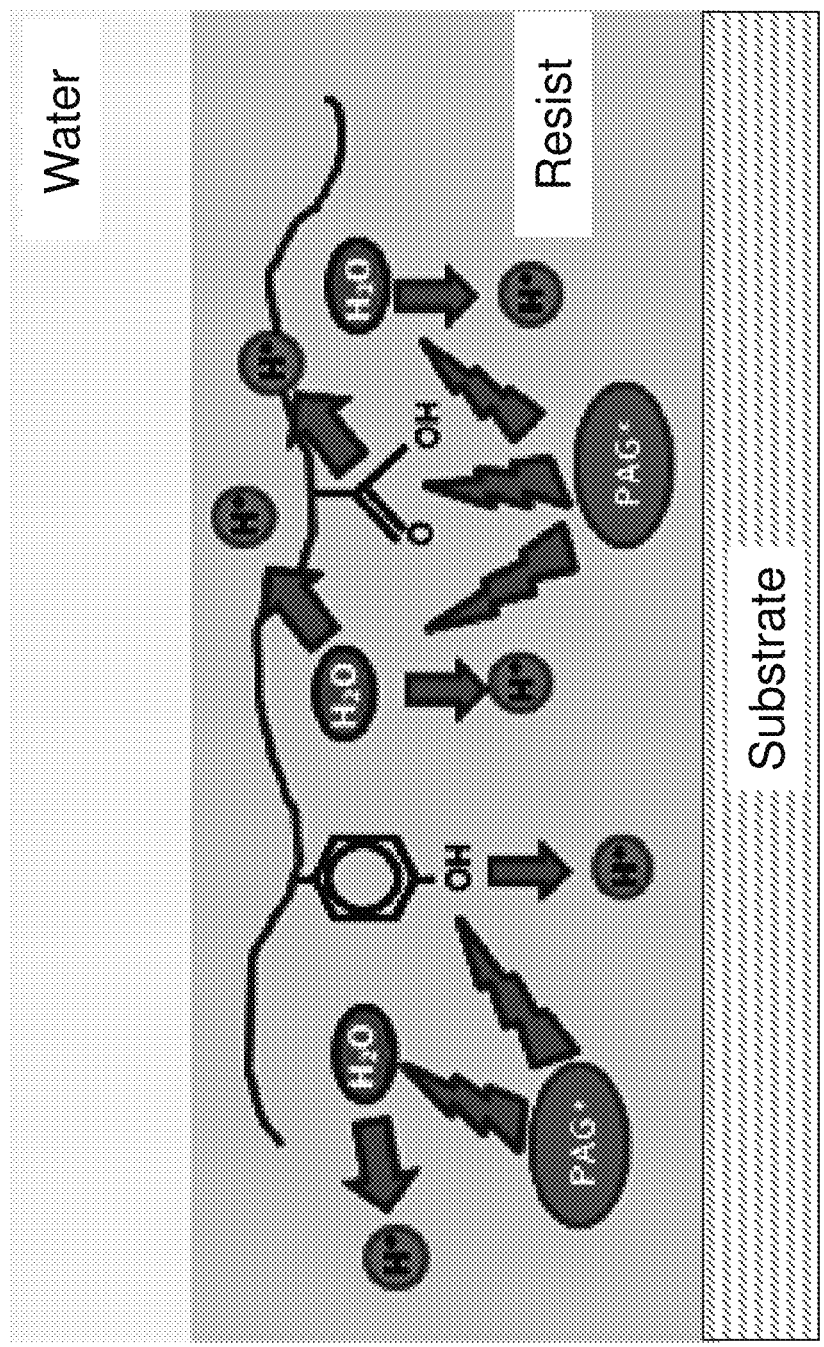
FIG. 2 is a schematic diagram of chemical reactions that occurs during an immersion bake step according to an embodiment of the present disclosure.

The immersion PEB process of various embodiments may include applying hot water or another protic solvent over an EUV photoresist layer that has been irradiated with an EUV radiation (i.e., post exposure) and thus, includes patterned irradiated regions. FIG. 2 illustrates how the PAG molecules generate protons from polymer chains. In the case of a conventional PEB process for ultraviolet lithography, protons are emitted only by the PAG attacking hydroxyl or carboxyl groups. In the case of the immersion PEB process of various embodiments, protons are obtained by both PAGs attacking hydroxyl/carboxyl groups and molecules of the water or other protic solvent puddled over the EUV photoresist layer. The protic solvent provides more efficient generation of protons within the EUV photoresist layer. Thus, more efficient deprotection can be achieved with the same amount of EUV irradiation on the EUV photoresist layer, and the throughput of the EUV lithography process can be increased.

As used herein, "protic solvent" refers to a solvent that has a hydrogen atom bound to an oxygen atom (as in a hydroxyl group) or to a nitrogen atom (as in an amine group). As such, a protic solvent readily donates protons (H$^+$) (which are referred to as labile protons) to a receptor. Non-limiting examples of protic solvents include water, acetic acid, formic acid, nitromethane, methanol, ethanol, propanol, isopropanol, and n-butanol.

Figure 3:
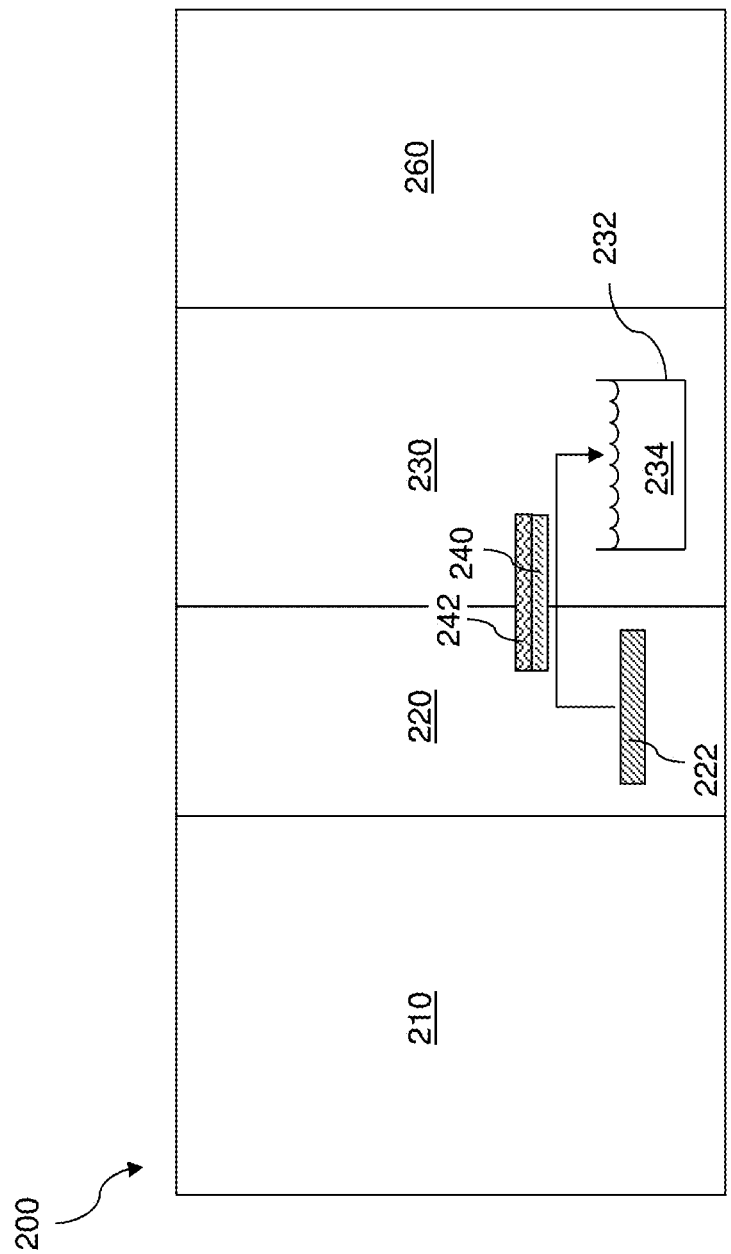
FIG. 3 is a schematic diagram illustrating an exemplary EUV lithography system according to an embodiment of the present disclosure.

An example lithography system 200 according to an embodiment of the present disclosure is illustrated in FIG. 3. The lithography system 200 includes an extreme ultraviolet (EUV) light source module 210, an exposure module 220, and an immersion post-exposure bake (PEB) module 230. The EUV light source module 210 includes an EUV light source and an optics system. A reticle can be loaded into the EUV light source module 210. The optics system of the EUV light source module can be configured to provide an EUV radiation having spatial intensity modulation that replicates an image of the reticle to the exposure module 220.

The exposure module 220 includes an exposure stage 222 onto which a substrate 240 with a coating of an EUV photoresist layer 242 can be loaded. The lithography system 200 can include a photoresist coater module (not expressly shown), which can be used to apply the coating of the EUV photoresist layer 242 on a top surface of the substrate 240.

The exposure module 220 is configured to illuminate the EUV photoresist layer 242 over the substrate 240 with EUV radiation from the EUV light source module 210. Upon loading of the substrate 240 on the exposure stage 222, the EUV photoresist layer 242 is irradiated with EUV radiation including a pattern of the reticle.

The immersion PEB module 230 can be configured to apply a protic solvent 234 to the EUV photoresist layer 242, heat or bake the protic solvent 234 and EUV photoresist layer 242 to a target temperature for period of time, and subsequently dry the EUV photoresist layer by removing the protic solvent. The protic solvent 234 can be provided in a container 232 into which the substrate 240 with the EUV photoresist layer 242 can be immersed in the protic solvent. Alternatively, the protic solvent 234 may be poured or sprayed on a top surface of the EUV photoresist layer 242, such as to form a puddle on the EUV photoresist layer 242.

The development module 260 can be configured to develop the EUV photoresist layer 242 by removing deprotected portions of the EUV photoresist layer selective to protected portions of the EUV photoresist layer.

Figure 4:
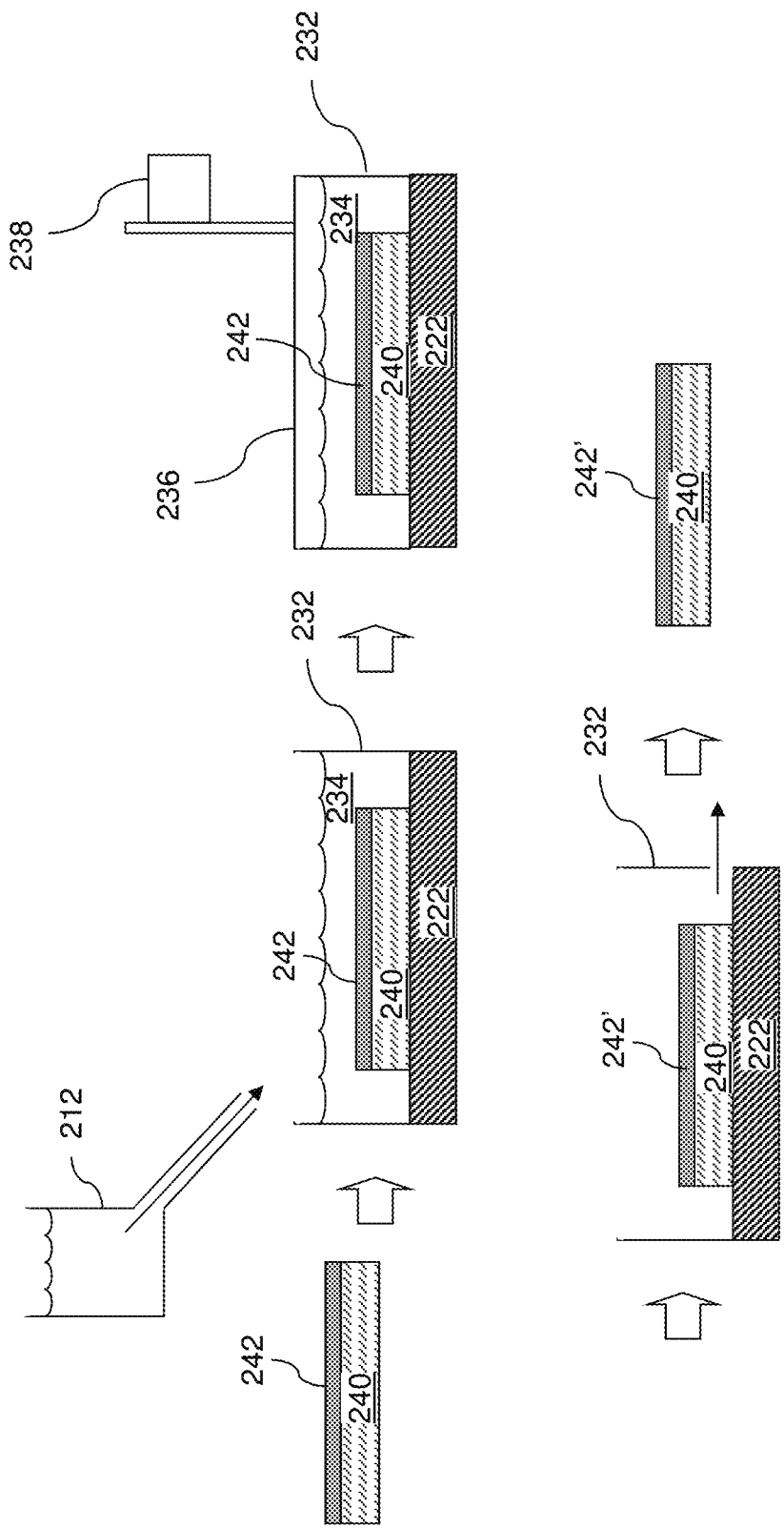
FIG. 4 is a schematic diagram of processing steps within the post-exposure bake process according to an embodiment of the present disclosure.

FIG. 4 illustrates an immersion post-exposure bake (PEB) process that can be performed within the immersion PEB module 230. A substrate 240 with a post-exposure EUV photoresist layer 242 thereupon is provided from the exposure module 220. In a first processing step in the immersion PEB module 230, the protic solvent 234 is applied to the post-exposure EUV photoresist layer 242 on the substrate 240 photoresist. The applied protic solvent 234 can include water or other protic solvents. The protic solvent 234 can be applied to cover the entire top surface of the post-exposure EUV photoresist layer 242. In one embodiment, a puddle of the protic solvent 234 may be formed by spraying or pouring the solvent over the post-exposure EUV photoresist layer 242. In this case, the lateral extent of a puddle of the protic solvent 234 may be limited to the area of the post exposure EUV photoresist layer 242. Alternatively, a laterally retaining structure, such as a cylindrical wall, may be used to laterally confine the protic solvent 234. In one embodiment, the puddle of the protic solvent 234 over the post-exposure EUV photoresist layer 242 may be formed by immersing the post-exposure EUV photoresist layer 242 in an open container 232 or a tank.

In one embodiment, the immersion PEB module 230 includes a container 232, which can be configured to provide a sealed volume that includes the substrate 240 with the post-exposure EUV photoresist layer 242 thereupon and a pool of the protic solvent 234. In one embodiment, the immersion PEB module 230 comprises a container 232 and a lid 236 that are configured to form a sealed volume containing the substrate 240, the post-exposure EUV photoresist layer 242, and the protic solvent 234.

In one embodiment, a protic solvent dispensation system 212 may be provided, which can be configured to dispense a portion of the protic solvent 234 over the post-exposure EUV photoresist layer 234 to form a puddle or fill a container 232. In one embodiment, the protic solvent dispensation system 212 comprises a protic solvent tank including the protic solvent. In one embodiment, the protic solvent 234 can be dispensed into a container 232 such that the substrate 240 with the EUV photoresist layer 242 is immersed within a dispensed portion of the protic solvent 234 within the container 232.

In one embodiment, the protic solvent 234 can comprise, and/or consist essentially of, a liquid that permeates the post-exposure EUV photoresist layer 242 during subsequent heating of the post-exposure EUV photoresist layer 242 to provide protons for accelerating a deprotection reaction for EUV irradiated portions of the post-exposure EUV photoresist layer 242. In one embodiment, the protic solvent 234 is selected from water, acetic acid, formic acid, nitromethane, methanol, ethanol, propanol, isopropanol, or n-butanol.

In one embodiment, the immersion PEB module 230 can include a heater 222 configured to heat contents within the sealed volume. In one embodiment, the heater 222 can be configured to heat the substrate 240, the EUV photoresist layer 242, and the protic solvent 234 to a target temperature at which the PEB process is performed. The target temperature is referred to herein as the PEB temperature. In one embodiment, the PEB temperature can be a temperature above the ambient temperature (which is the temperature of the ambient within the immersion PEB module 230, such as the room temperature of 20 degrees Celsius) while the protic solvent 234 is present over the post-exposure EUV photoresist layer 242. In one embodiment, the immersion PEB module 230 can be configured to set the PEB temperature to a boiling temperature of the protic solvent 234 at a pressure to which the protic solvent 234 is subjected during the PEB process.

Due to the presence of the protic solvent 234 over the post-exposure EUV photoresist layer 242, the PEB temperature is limited by the boiling point of the protic solvent 234. Thus, if the PEB process is performed at 1 atmospheric pressure (760 mmHg), the PEB temperature will be limited to the normal boiling point of the protic solvent 234.

To enable the PEB temperature to be higher the normal boiling point of the protic solvent 234, the immersion PEB module 230 can be configured (e.g., with a lid that will seal the container 232 and a pressurizing system) to be pressurized during the PEB process. In various embodiments, the immersion PEB module 230 can be configured to be pressurized to a pressure in a range from 600 mmHg to 760 mmHg, in a range from 760 mmHg to 1,520 mmHg, in a range from 1,520 mmHg to 3,800 mmHg, or in a range from 3,800 mmHg to 15,200 mmHg.

During the PEB process the temperature and the pressure inside the encapsulated container can be ramped to the PEB temperature and a target pressure, which is referred to herein as a post-exposure baking (PEB) pressure. In various embodiments, the PEB pressure may be in a range from 600 mmHg to 760 mmHg, in a range from 760 mmHg to 1,520 mmHg, in a range from 1,520 mmHg to 3,800 mmHg, or in a range from 3,800 mmHg to 15,200 mmHg. In various embodiments, the PEB temperature can be in a range from a boiling temperature of the protic solvent at 1 atmospheric pressure (760 mmHg) to a boiling temperature of the protic solvent at 20 atmospheric pressures (15,200 mmHg).

In one embodiment, the post-exposure EUV photoresist layer 242 and the protic solvent 234 can be placed within a container 232 with an opening, and the opening can be sealed with a lid 236. The encapsulated container (232, 236) may be initially filled with an inert gas such as nitrogen or argon at a pressure in a range from 1 atmospheric pressure (760 mmHg) and 20 atmospheric pressures (15,200 mmHg).

In one embodiment, the immersion PEB module 230 can include a pressure gauge 238 configured to monitor the pressure inside the sealed volume. In this case, the pressure inside the encapsulated container (232, 236) may be monitored by the pressure gauge attached to the encapsulated container (232, 236). For example, the pressure gauge may be attached to the lid 236 of the encapsulated container (232, 236). A heater controller (not expressly shown) can be configured to control the level of heat generation by the heater 222 based on pressure measurements from the pressure gauge 232. A pressure controller (such as a controlled vent valve) may be provided to control the pressure inside the sealed volume.

The encapsulated container (232, 236) can be heated to the boiling point of the protic solvent 234 under the initial pressure inside the encapsulated container (232, 236). The PEB temperature can be in a range from 100 degrees Celsius to 200 degrees, and the PEB pressure can be in a range from 1 atmospheric pressure to 20 atmospheric pressures. The duration of baking step (in which the post-exposure EUV photoresist layer 242 is at the PEB temperature and at the PEB pressure) may be in a range from 10 seconds to 5 minutes, although lesser and greater durations can also be used.

In processes in which the PEB pressure is greater than 1 atmospheric pressure, the substrate 240, the post-exposure EUV photoresist layer 242, and the protic solvent 234 can be disposed within a container 232, and the container 232 sealed to provide an enclosed volume with the protic solvent 234, the substrate 240, and the post-exposure EUV photoresist layer 242 therein. The enclosed volume can be pressurized to a PEB pressure greater than 1 atmospheric pressure, such as between 1 atmospheric pressure (760 mmHg) and 20 atmospheric pressures (15,200 mmHg). In some embodiments, the temperature of the substrate 240, the post-bake EUV photoresist layer 242, and the protic solvent 234 can be ramped to a temperature up to the boiling temperature of the protic solvent 234 at the PEB pressure.

The temperature and the pressure of the container 232 can be subsequently reduced, for example, by venting vapor inside the encapsulated container and by cooling the encapsulated container. Following the PEB process, the post-exposure EUV photoresist layer 242 is referred to as a thermally treated EUV photoresist layer 242'.

After the post-exposure bake, the substrate 240 with the thermally treated EUV photoresist layer 242' is dried by removing the protic solvent 234 therefrom, such as by spin-drying the substrate 240. In one embodiment, the protic solvent 234 can be removed from the thermally treated EUV photoresist layer 242' by spin-drying the thermally treated EUV photoresist layer 242'. The drying step may be performed within the container 232 or outside the container 232 on a separate drying station. The substrate 240 can then be cooled down further, and transferred to a stage for the next processing step. The next processing step can be a photoresist development step in which the pattern in the thermally treated EUV photoresist layer 242' is developed. In case of positive tone development (PTD), the irradiated portions of the thermally treated EUV photoresist layer 242' are removed selectively to non-irradiated portions of the thermally treated EUV photoresist layer 242'. In case of negative tone development (NTD), the non-irradiated portions of the thermally treated EUV photoresist layer 242' are removed selectively to the irradiated portions of the thermally treated EUV photoresist layer 242

Figure 5:
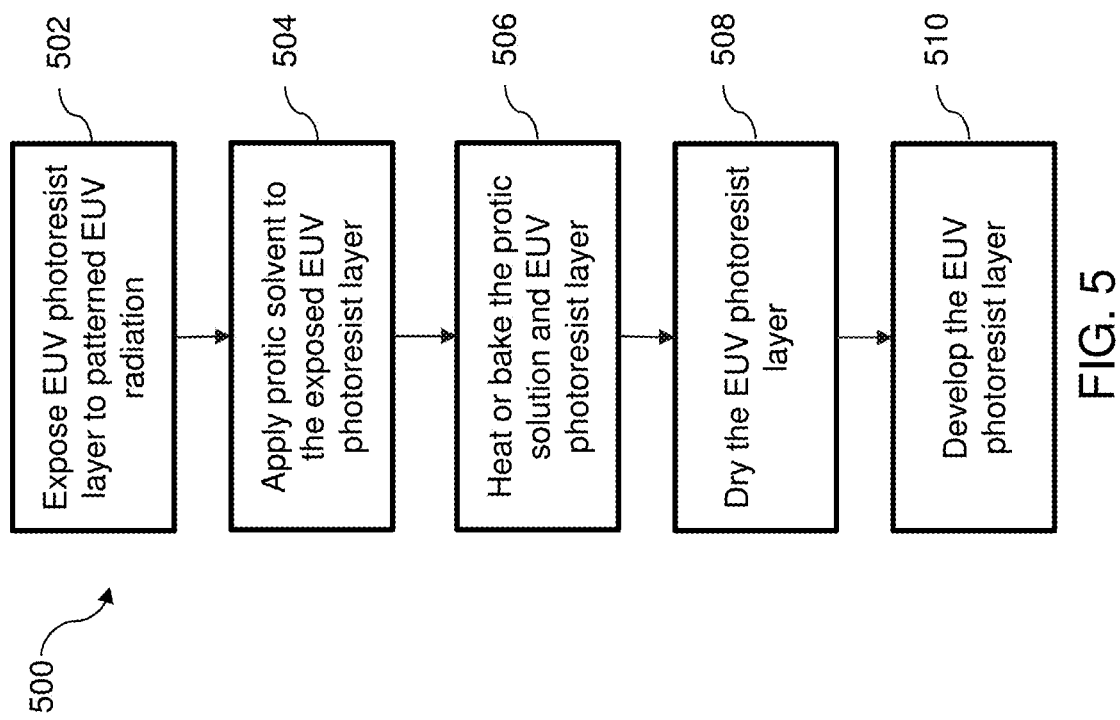
FIG. 5 is a process flow diagram illustrating a method of performing an EUV photolithography process according to various embodiments of the present disclosure.

FIG. 5 illustrates a method 500 for performing an extreme ultraviolet lithography process including an immersion post post-exposure bake according to an embodiment of the present disclosure. In step 502, an EUV photoresist layer on a substrate is exposed to patterned EUV radiation, such as EUV radiation applied through a pattern of a reticle.

In step 504, a protic solvent is applied to the exposed EUV photoresist layer. As described above, the protic solvent may be any of water, acetic acid, formic acid, nitromethane, methanol, ethanol, propanol, isopropanol, n-butanol or another solvent that donates labile protons to a receptor. Also as described above, the protic solvent may be applied in step

504 as a puddle (e.g., by pouring, spinning, spraying, etc.) on the EUV photoresist layer or by immersing the substrate and EUV photoresist layer in the protic solvent.

In step 506, the protic solvent and EUV photoresist layer are heated to or baked at a PEB temperature and held at that temperature for a duration. In some embodiments, the protic solvent, EUV photoresist layer and substrate may be pressurized to a PEB pressure so that the PEB temperature is greater than the 1 atmospheric pressure boiling point of the protic solvent. In various embodiments, the PEB pressure may be between 1 atmospheric pressure (760 mmHg) and 20 atmospheric pressures (15,200 mmHg). In various embodiments, the PEB temperature may be up to the boiling temperature of the protic solvent at the PEB pressure. In various embodiments, the duration of the heating or baking may be in a range from 10 seconds to 5 minutes, although lesser and greater durations can also be used.

In step 508, the EUV photoresist layer is dried to remove the protic solution. In one embodiment, step 508 includes spin-drying the substrate and EUV photoresist to remove the protic solution by centripetal force. Other methods of drying may be used.

In step 510, the EUV photoresist layer is developed using convention methods and solutions for developing exposed EUV photoresist layers.

The operations of the method 500 may be automated within an EUV lithography system (e.g., system 200) such that the steps are performed by machine-controlled operations without human interaction.

The methods of various embodiments can be used to increase the throughput of an EUV photolithography system without performance degradation of the EUV photolithography system. Metal contamination is not an issue in the processing method of various embodiments. The EUV lithographic processing method of various embodiments can be used for high volume mass production of semiconductor devices using EUV patterning steps. By adopting the EUV lithography for high volume mass production, formation of fine and complex patterns can be done without multi-exposure patterning processes or spacer formation processes. Higher density of memory cells and/or peripheral circuit devices, enhanced device characteristics of memory cells, manufacturing cost reduction, and reduction of turn-around time can be achieved by the EUV lithography method of various embodiments.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of performing extreme ultraviolet lithography process, comprising:
    applying a protic solvent over an extreme ultraviolet (EUV) photoresist layer located over a substrate after exposure to EUV radiation;
    heating the protic solvent on the EUV photoresist layer to a post-exposure bake temperature while the EUV photoresist layer is immersed in the protic solvent or while the protic solvent is present over the EUV photoresist layer as a puddle; and
    removing the protic solvent from above the EUV photoresist layer prior to developing the EUV photoresist layer.

2. The method of claim 1, wherein the protic solvent permeates the EUV photoresist layer during heating of the EUV photoresist layer to provide protons for accelerating a deprotection reaction for EUV irradiated portions of the EUV photoresist layer.

3. The method of claim 1, wherein the protic solvent is selected from water, acetic acid, formic acid, nitromethane, methanol, ethanol, propanol, isopropanol, or n-butanol.

4. The method of claim 1, wherein heating the protic solvent on the EUV photoresist layer to the post-exposure bake temperature comprises heating the protic solvent to a boiling point of the protic solvent at 1 atmospheric pressure.

5. The method of claim 1, wherein heating the protic solvent on the EUV photoresist layer to the post-exposure bake temperature comprises pressurizing the protic solvent on the EUV photoresist layer to a post-exposure bake pressure, and wherein the post-exposure bake temperature is less than or equal to a boiling temperature of the protic solvent at the post-exposure bake pressure.

6. The method of claim 5, wherein:
    the post-exposure bake pressure is in a range from 1 atmospheric pressure to 20 atmospheric pressure; and
    the post-exposure bake temperature is in a range from a boiling temperature of the protic solvent at 1 atmospheric pressure to a boiling temperature of the protic solvent at 20 atmospheric pressure.

7. The method of claim 5, wherein applying a protic solvent over an EUV photoresist layer after exposure to EUV radiation comprises:
    placing the substrate with the EUV photoresist layer thereupon in a container; and
    dispensing the protic solvent into the container so that the EUV photoresist layer is immersed in the protic solvent.

8. The method of claim 7, further comprising:
    sealing the container to provide an enclosed volume with the protic solvent, the substrate, and the EUV photoresist layer therein; and
    pressuring the enclosed volume to a post-exposure bake pressure greater than 1 atmospheric pressure.

9. The method of claim 8, further comprising ramping a temperature of the substrate, the EUV photoresist layer, and the protic solvent to a boiling temperature of the protic solvent at the post-exposure bake pressure.

10. The method of claim 1, wherein removing the protic solvent from the EUV photoresist layer is performed by spin-drying the EUV photoresist layer.

11. The method of claim 10, wherein the spin-drying step is performed within a container in which the protic solvent is heated to the post-exposure bake temperature.

12. The method of claim 10, wherein the spin-drying step is performed outside a container in which the protic solvent is heated to the post-exposure bake temperature on a separate drying station.

13. The method of claim 1, wherein the post-exposure bake temperature comprises a boiling temperature of the protic solvent at a pressure to which the protic solvent is subjected while the EUV photoresist layer is immersed in the protic solvent or while the protic solvent is present over the EUV photoresist layer as the puddle.

14. The method of claim 1, wherein applying the protic solvent comprises forming the puddle of the protic solvent by spraying or pouring the protic solvent over the EUV photoresist layer.

15. The method of claim 14, wherein the protic solvent on the EUV photoresist layer is heated to the post-exposure bake temperature while the protic solvent is present over the EUV photoresist layer as the puddle, and wherein a lateral extent of the puddle of the protic solvent is limited to an area of the EUV photoresist layer.

16. The method of claim 1, wherein applying the protic solvent comprises immersing the EUV photoresist layer in the protic solvent that fills a container or a tank, such that the protic solvent is laterally confined by a wall of the container or the tank, and the protic solvent on the EUV photoresist layer is heated to the post-exposure bake temperature while the EUV photoresist layer is immersed in the protic solvent.

17. The method of claim 1, further comprising cooling the substrate after removing the protic solvent and prior to developing the EUV photoresist layer.

* * * * *